(12) United States Patent
Amblard et al.

(10) Patent No.: US 7,056,646 B1
(45) Date of Patent: Jun. 6, 2006

(54) USE OF BASE DEVELOPERS AS IMMERSION LITHOGRAPHY FLUID

(75) Inventors: Gilles Amblard, San Jose, CA (US); Bhanwar Singh, Morgan Hill, CA (US); Khoi A. Phan, San Jose, CA (US)

(73) Assignee: Advanced Micro devices, Inc., Sunnyvale, CA (US)

( * ) Notice: Subject to any disclaimer, the term of this patent is extended or adjusted under 35 U.S.C. 154(b) by 434 days.

(21) Appl. No.: 10/676,749

(22) Filed: Oct. 1, 2003

(51) Int. Cl.
*G03F 7/20* (2006.01)

(52) U.S. Cl. ...................... 430/311; 430/322

(58) Field of Classification Search ............... 430/311, 430/322
See application file for complete search history.

(56) References Cited

U.S. PATENT DOCUMENTS

| | | | |
|---|---|---|---|
| 4,480,910 A * | 11/1984 | Takanashi et al. ............ 355/30 |
| 5,879,866 A | 3/1999 | Starikov et al. ............ 430/395 |
| 5,900,354 A | 5/1999 | Batchelder .................. 430/395 |
| 6,309,809 B1 | 10/2001 | Starikov et al. ............ 430/395 |
| 2002/0163629 A1 | 11/2002 | Switkes et al. ................ 355/53 |
| 2003/0123040 A1 | 7/2003 | Almogy ....................... 355/69 |
| 2003/0174408 A1 | 9/2003 | Rostalski et al. ........... 359/642 |

OTHER PUBLICATIONS

Hoffnagle et al., "Liquid Immersion Deep-ultraviolet Interferometric Lithography", J. Vac. Sci. Technol. B 17(6), Nov./Dec. 1999, pp. 3306-3309.*

* cited by examiner

*Primary Examiner*—Kathleen Duda
(74) *Attorney, Agent, or Firm*—Amin & Turocy, LLP

(57) ABSTRACT

Disclosed are immersion lithography methods involving using a base developer as an immersion lithography fluid. Consequently, it is unnecessary to contact a developer with an irradiated resist after the immersion lithography fluid is removed.

20 Claims, 6 Drawing Sheets

USE OF BASE DEVELOPERS AS IMMERSION LITHOGRAPHY FLUID

TECHNICAL FIELD

The present invention generally relates to improved fluids for use in immersion lithography. More particularly, the present invention relates to using resist developers as the liquid between a projection lens and a wafer to improve immersion lithography.

BACKGROUND ART

Conventional photolithography involves projecting actinic radiation onto a photoresist clad wafer. The physical limit to the numerical aperture (NA) for such exposure systems using air as a medium between a lens and the wafer is 1. NA is actually determined by the acceptance angle of the lens and the index of refraction of the medium surrounding the lens. Microscopy has for some time employed oil for resolution enhancement.

Immersion technology offers improved resolution enhancement and higher numerical apertures over conventional projection lithography. In immersion lithography, the space between the projection lens and the wafer in a tool is filled with a liquid. Tat is, immersion lithography uses a thin layer of liquid to further focus resolution. However, immersion lithography typically requires large, expensive lenses.

While the immersion is promising, there are a number of concerns associated with implementing immersion lithography that require resolution in order for the technology to gain wide acceptance. For example, there is a tendency for the liquid in immersion lithography to develop annoying micro-bubbles, which ruins the benefits offered by the technology. Maintaining a consistent bubble free liquid between the lens and the wafer is very difficult. Polarization of the lens is also a significant concern.

Water is the most common liquid employed in current immersion lithography systems. This is because water has an index of refraction of about 1.47, an absorption of less than about 5% at working distances of up to 6 mm, is compatible with most photoresists and lens, and in an ultrapure form, is non-contaminating. Specifically, the liquid employed for most immersion applications is double deionized, distilled, degassed water. Nevertheless, improvements in immersion lithography are desired.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to using a base developer as an immersion lithography fluid in immersion lithography to improve efficiency of the immersion lithography process. In immersion lithography, the immersion lithography fluid is positioned between the lens and the wafer being exposed. When a base developer is used as an immersion lithography fluid, the resist is patterned when removing the immersion lithography fluid from the wafer after irradiation. Consequently, the requirement of a separate development step is eliminated, thereby simplifying the lithographic process.

One aspect of the present invention is an immersion lithography method involving providing a base developer as an immersion lithography fluid between a projection lens and a resist, irradiating portions of the resist through the projection lens and the immersion lithography fluid, and removing the immersion lithography fluid and irradiated portions of the resist to provide a patterned resist on the structure. As a result, it is not necessary to contact a developer with the irradiated resist after the immersion lithography fluid is removed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention involves using a base developer as an immersion lithography fluid in an immersion lithography to improve efficiency of the overall process. After irradiating portions of the resist through the immersion lithography fluid, it is not necessary to rinse the immersion lithography fluid from the semiconductor structure and then contact the irradiated resist clad semiconductor structure with a developer to remove the irradiated portions or unirradiated portions of the resist. That is, a developer is not contacted with the irradiated but not yet patterned resist after the immersion lithography fluid is removed. The present invention provides a simplified process to obtain a patterned resist via immersion lithography.

The medium between the lens and the wafer being exposed, occupied by the immersion lithography fluid, needs to have an index of refraction greater than 1, a relatively low optical absorption at the exposure wavelength, be compatible with the resist and the lens, and be non-contaminating. Base developers have an index of refraction greater than 1, a relatively low optical absorption at the exposure wavelength, are compatible with the resist and the lens, and are non-contaminating. Therefore, base developers may be advantageously employed as an immersion lithography fluid. Another benefit associated with employing a base developer in some instances as the immersion lithography fluid is that the projection lens remains clean, as bases act as glass cleaners compared to using other fluids.

Base developers contain at least a base compound and a solvent. Solvents typically include water, but polar organic liquids may additionally or alternatively be employed. For example, polar organic liquids that may be used alone, in combination with water, or in combination with other organic liquids include methanol, ethanol, isopropanol, acetone, polyhydric alcohols such as glycols such as propylene, ethylene and methylene glycols, and the like. Water is preferably deionized water, and more preferably double deionized, distilled, degassed water.

Base compounds include organic amines, alkali metal hydroxides, alkaline earth metal hydroxides, ammonium hydroxides, tetraalkylammonium hydroxides, alkali metal carbonates and bicarbonates, alkaline earth metal carbonates and bicarbonates, ammonium carbonates and bicarbonates, tetraalkylammonium carbonates and bicarbonates, alkali metal borates, ammonium borates, tetratalkylammonium borates, alkali metal dihydrogen-phosphates, alkaline earth metal dihydrogen-phosphates, ammonium dihydrogen-phosphates, tetraalkylammonium dihydrogen-phosphates, alkali metal silicates, alkaline earth metal silicates, ammonium silicates, tetraalkylammonium silicates, and the like.

Specific examples of base compounds include sodium hydroxide, potassium hydroxide, calcium hydroxide, ammonium hydroxide, tetramethylammonium hydroxide, tetraethylammonium hydroxide, dimethyldiethylammonium hydroxide, sodium bicarbonate, tetramethylammonium bicarbonate, disodium carbonate, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl) trimethylammonium hydroxide, 2-hydroxyl trimethyl ammonium hydroxide, lithium borate, sodium borate, sodium hydrogen-phosphate, ammonium dihydrogen-phosphate, sodium dihydrogen-phosphate, potassium dihydrogen-phosphate, lithium phosphate, lithium silicate, potassium silicate, sodium silicate, monomethylamine, dimethylamine, trimethylamine, diethylamine, triethylamine, monoiso-pyruamine, di-isopyruamine, n-propylamine, n-butylamine and 1,3-diaminopropane, di-n-propylamine, di-n-butylamine, 4,4'-diaminodiphenylamine, n,n-dimethylethylamine, n,n-diethylmethylamine, triethylamine, bis(dialkylamino)imines, monoethanolamine, diethanolamine, triethanolamine, diethylethanolamine, propanolaminec, and the like.

Base developers contain a solvent and from about 0.01% to about 20% by weight of at least a base compound. In another embodiment, the base developers contain a solvent and from about 0.05% to about 15% by weight of at least a base compound. In yet another embodiment, the base developers contain a solvent and from about 0.1% to about 10% by weight of at least a base compound.

Base developers include metal ion free developers and metal ion containing developers. Base developers include aqueous developers and organic/solvent developers. Base developers include amine free developers and amine containing developers.

The index of refraction of the base developer immersion lithography fluid can be modified by controlling the precise concentration of the base compound in the immersion lithography fluid. In this connection, it may be desirable to increase or decrease the index of refraction by making a slight increase or decrease in the concentration of the base compound in the immersion lithography fluid.

The temperature of the base developer immersion lithography fluid during and/or after irradiation is from about 10° C. to about 99° C. In another embodiment, the temperature of the base developer immersion lithography fluid during and/or after irradiation is from about 15° C. to about 75° C. In yet another embodiment, the temperature of the base developer immersion lithography fluid during and/or after irradiation is from about 20° C. to about 50° C. The temperature may be increased and/or decreased to partially control the index of refraction of the base developer immersion lithography fluid. The temperature may be increased to induce similar effects achieved by a post bake step, which is not performed.

The pH of the base developer immersion lithography fluid is greater than about 8. In another embodiment, the pH of the base developer immersion lithography fluid is greater than about 9. In yet another embodiment, the pH of the base developer immersion lithography fluid is greater than about 10.

Additional optional components may be included in the base developer immersion lithography fluid. Examples of such optional additives include surfactants (anionic surfactants, cationic surfactants, nonionic surfactants, and/or amphoteric surfactants), perfluoropolyethers, pH adjusting agents, pH buffers, rinse aids, and the like.

Resists suitable for use with base developer immersion lithography fluids are those that do not require a post exposure bake. Heating a partially irradiated resist, a so called post exposure bake, facilitates a high quality patterning. For example, post exposure bake facilitates the deprotection reaction in chemically amplified resists. Although post exposure bake is often desirable with many resists, in the present invention a resist is excluded only if the post exposure bake is absolutely required. Consequently, if a given resist can be partially irradiated and then developed into a patterned resist without a post exposure bake step, the resist can be employed in the present invention.

The resists undergoes a chemical reaction in the areas exposed to actinic radiation. The chemical reaction makes the exposed portion of the resist more or less soluble in a given developer. Generally speaking, the resist can be a positive tone resist (irradiated portions removed by developer) or a negative tone resist (unirradiated portions removed by developer).

Examples of various resists include DQN resists (containing diazonaphthoquinone and a novolac polymer), chemically amplified resists (such containing a photoacid generator and a hydroxystyrene or t-butylacrylate polymer), polymethylmethacrylate resists, polyimide resists, polyester resists, melamine-formaldehyde polymers, polyvinylpyrrolidone, siloxane polymers, poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, partially adamantyl substituted polymethacrylate and the like. All possible resist are not listed in the interest of brevity. Resists are commercially available from a number of sources.

The resist is formed on the semiconductor substrate in any suitable manner, including spin-on techniques, spray techniques, chemical vapor deposition, and the like.

Optionally, in some instances, a (bottom antireflective coating) BARC may be positioned under the resist. The BARC is typically applied to the semiconductor substrate via spin-on techniques. The BARC minimizes and/or eliminates reflectivity concerns associated with exposing and developing the resist. The BARC contains a dye and a developer soluble film forming material. When the film forming material is developer soluble, the BARC can be removed from the wafer when patterning the resist. That is, the portions of the BARC that are under the portions of the resist which are removed by the base developer immersion lithography fluid are also removed by the base developer immersion lithography fluid in the same act. Combining these functions serves to simplify the resist patterning process.

Examples of the film forming material include organic materials such as poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, poly(butene-1-sulfone), a polymer formed by the hydrogenation of a phenol formaldehyde (novolak) or a poly(vinylphenol) resin, polymers of hydroxystyrene and acrylate, methacrylate, mixtures of acrylate and methacrylate, adamantyl methacrylate, 3-oxocyclohexyl methacrylate, tetrahydropyrannymethacrylate, trycyclodecanyl acrylate, isobornyl polymers, polynorbornene, polyanthrylmethacrylate, poly(vinylmethyl ether-co-maliec anhydride), poly(styrene-co-maliec anhydride), a partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, partially adamantyl substituted polymethacrylate, polyvinylidine chloride, polyvinyl acetate, poly(epichlorihydrin), chlorinated polyethylene, brominated and chlorinated polyisobutylenes, halogenated acrylates and methacrylates, novolacs, polyacetals, and alpha substituted polymers such as methyl methacrylates and methylacrylonitrile.

In another embodiment, the film forming material contains a polyamic acid (ester)/imide polymer composition made from polyamines and polyanhydrides. In yet another embodiment, the film forming material contains a polyimide precursor which reacts in use to form a polyimide resin. In still yet another embodiment, the film forming material contains polymers which include copolymers of sulfur dioxide such as poly(neopentyl sulfone), polybutene-1-sulfone, halogenated polymers and copolymers such as poly(vinylidine chloride-co-vinyl acetate), poly(epichlorihydrin), chlorinated polyethylene, brominated and chlorinated polyisobutylenes, halogenated acrylates and methacrylates and copolymers, polyacetals and acetal copolymers and alpha substituted polymers such as methyl methacrylates and methylacrylonitrile, and equivalent polymers.

The dye is effective in absorbing light or actinic radiation. In one embodiment, dye is effective in absorbing light over a broad spectrum of light, for example, from about 1 nm to about 800 nm. Exemplary dyes include one or more of curcumin, bixin, norbixin, Solvent Blue 45, Solvent Red 92, Solvent Blue 44, Solvent Blue 35, Solvent Red 111, Solvent Orange 11, Pylakrome Green, IR-99, IR-125, and Solvent Red 127. In one embodiment, the BARC absorbs light having a wavelength of about 450 nm or less. In another embodiment, the BARC absorbs light having a wavelength of about 250 nm or less. In yet another embodiment, the BARC absorbs light having a wavelength of about 200 nm or less.

The wavelength of light (actinic radiation) employed is selected so that a chemical change takes place in the irradiated portions of the resist. Generally speaking the light employed has a wavelength of about 450 nm or less. In another embodiment, the light employed has a wavelength of about 250 nm or less. In yet another embodiment, the light employed has a wavelength of about 200 nm or less. In still yet another embodiment, the light employed has a wavelength of about 160 nm or less. In still yet another embodiment, the light employed has a wavelength of about 100 nm or less. Specific examples of wavelengths include about 436 nm light, about 365 nm light, about 248 nm light, about 193 nm light, about 157 nm light, about 13 nm light, about 11 nm light, X-rays, and e-beams.

The distance between the projection lens and the resist (which is typically the approximate thickness of the immersion lithography fluid, depending upon the nature of the immersion orientation) is suitable to provide a high quality image-wise exposure of selected portions of the resist. Preferably, the distance between the projection lens and the resist is short enough to permit at least about 80% transmission of the actinic radiation. More preferably, the distance between the projection lens and the resist is short enough to permit at least about 90% transmission of the actinic radiation. Even more preferably, the distance between the projection lens and the resist is short enough to permit at least about 95% transmission of the actinic radiation. In one embodiment, the distance between the projection lens and the resist is less than about 2,500 μm. In another embodiment, the distance between the projection lens and the resist is less than about 1,000 μm. In yet another embodiment, the distance between the projection lens and the resist is less than about 250 μm.

After portions of the resist are exposed to actinic radiation, a sufficient period of time is elapsed so that a chemical change occurs throughout substantially the entire thickness of the exposed portions of the resist, and so that the base developer immersion lithography fluid can solubilize either the exposed or unexposed portions of the resist (and in some optional embodiments, so that the corresponding underlying portions of the BARC are also solubilized by the immersion lithography fluid). Consequently, as the base developer immersion lithography fluid is removed from the wafer, a patterned resist wafer is produced.

In one embodiment, the immersion lithography fluid is removed from the wafer from about 2 seconds to about 200 minutes after irradiation. In another embodiment, the immersion lithography fluid is removed from the wafer from about 10 seconds to about 100 minutes after irradiation. In yet another embodiment, the immersion lithography fluid is removed from the wafer from about 15 seconds to about 50 minutes after irradiation. Optionally, after the base developer immersion lithography fluid is removed, the patterned resist clad wafer may be rinsed with water and preferably deionized water.

During the time in which the immersion lithography fluid is in contact with the irradiated resist, the substrate in some instances may be optionally agitated to facilitate solubilization of the exposed or unexposed portions of the resist and the corresponding underlying portions of the BARC, if present, so that a high quality patterned resist clad wafer is realized.

The patterned resist provide on the wafer by immersion lithography in accordance with the present invention has openings (vias, trenches, dual damascene openings, and the like) with cross sectional sizes as small as about 0.12 μm or less. In another embodiment, the openings in the patterned resist formed by immersion lithography in accordance with the present invention are as small as about 0.1 μm or less. In yet another embodiment, the openings in the patterned resist formed by immersion lithography in accordance with the present invention are as small as about 0.08 μm or less. In still yet another embodiment, the openings in the patterned resist formed by immersion lithography in accordance with the present invention are as small as about 0.07 μm or less.

The present invention may be understood and its advantages appreciated in conjunction with the process of FIGS. 1 to 6, wherein like numerals represent like features throughout.

Figure 1:
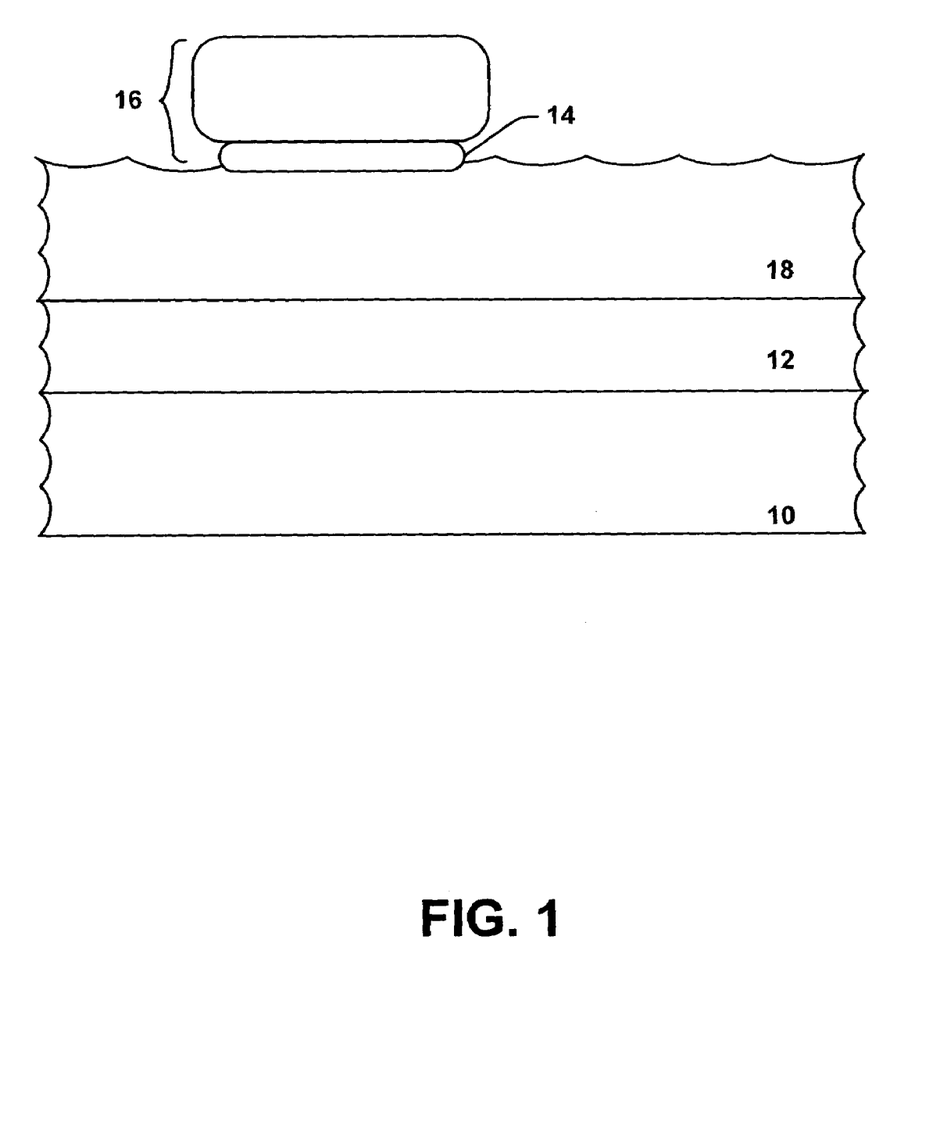
FIG. 1 is a cross sectional illustration of one aspect of an immersion lithography method in accordance with the present invention.
Figure 2:
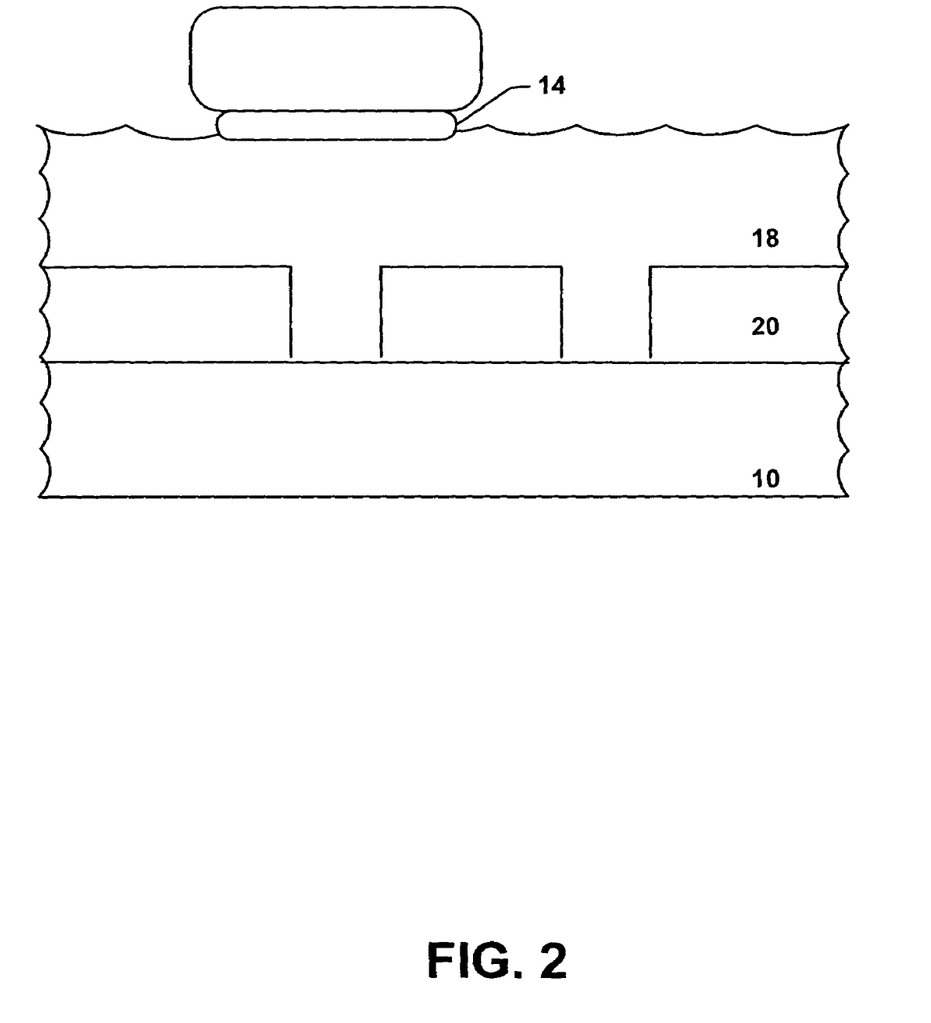
FIG. 2 is a cross sectional illustration of another aspect of an immersion lithography method in accordance with the present invention.
Figure 3:
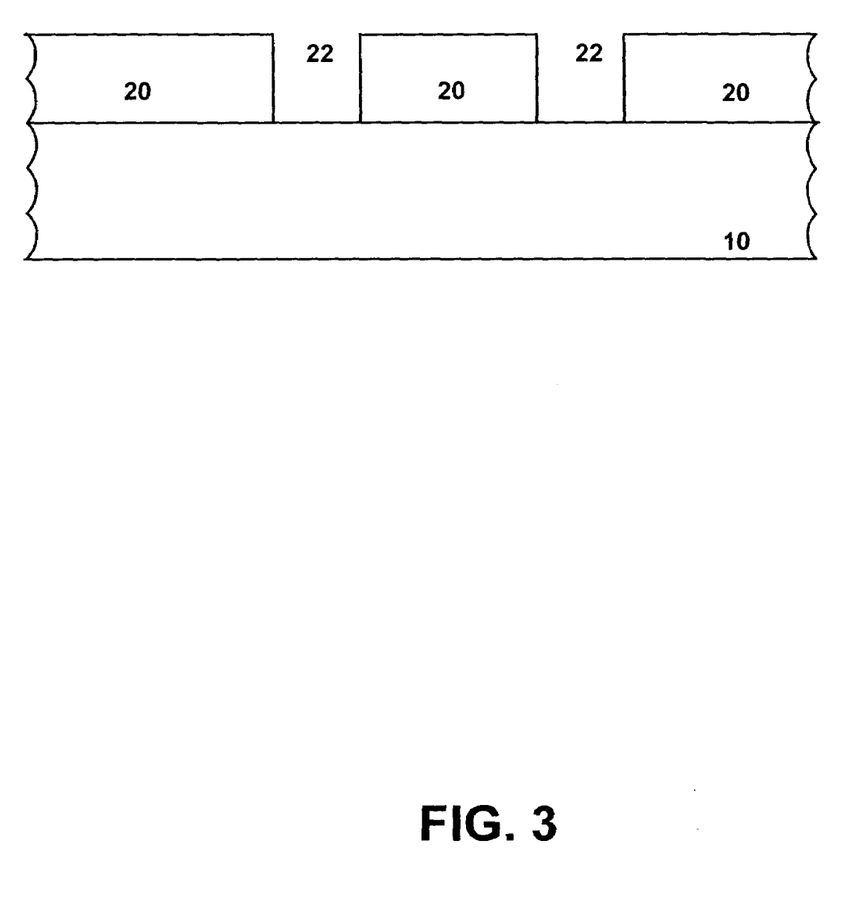
FIG. 3 is a cross sectional illustration of yet another aspect of an immersion lithography method in accordance with the present invention.

One aspect of the present invention is shown in FIGS. 1 to 3. Referring to FIG. 1, an immersion lithography arrangement is provided including a wafer 10 with a resist 12 thereover, and a base developer immersion lithography fluid 18 in the space between the resist 12 clad wafer 10 and a projection system 16. Specifically, the base developer immersion lithography fluid 18 is situated between the resist 12 and the final optic 14, such as a projection lens, of the projection system 16. Although not specifically shown, the projection system 16 can include one or more of a radiation source such as a laser, housing, motion components, imaging components such as various lenses and shutters, control components, a processor, a mask, fiber optic components, and a power supply, among other components/systems.

Radiation is generated and projected through final optic 14, such as 193 nm light, through the base developer immersion lithography fluid 18, and onto selected portions of the resist 12. In the selected portions of the resist 12, a chemical change takes place that makes either the selected portions or the unexposed portions of the resist 12 more soluble in the base developer immersion lithography fluid 18.

Referring to FIG. 2, due to this increased solubility, either the selected portions or the unexposed portions of the resist 12 go into solution, leaving a patterned resist 20 (the portions of the resist 12 that did not go into solution). A sufficient period of time elapses so that at least substantially the entire thickness of either the selected portions or the unexposed portions of the resist 12 go into solution and portions of the underlying wafer are in contact with the base developer immersion lithography fluid 18. The portions of the underlying wafer in contact with the base developer immersion lithography fluid 18 are not soluble in the base developer immersion lithography fluid 18.

Referring to FIG. 3, the base developer immersion lithography fluid 18, with either the selected portions or the unexposed portions of the resist 12 solubilized therein, is removed from the immersion lithography arrangement leaving a patterned resist 20 clad wafer 10. The patterned resist 20 has openings 22 therein where portions of the underlying wafer 10 are exposed. A developer is not contacted with the immersion lithography arrangement after the immersion lithography fluid is removed.

Figure 4:
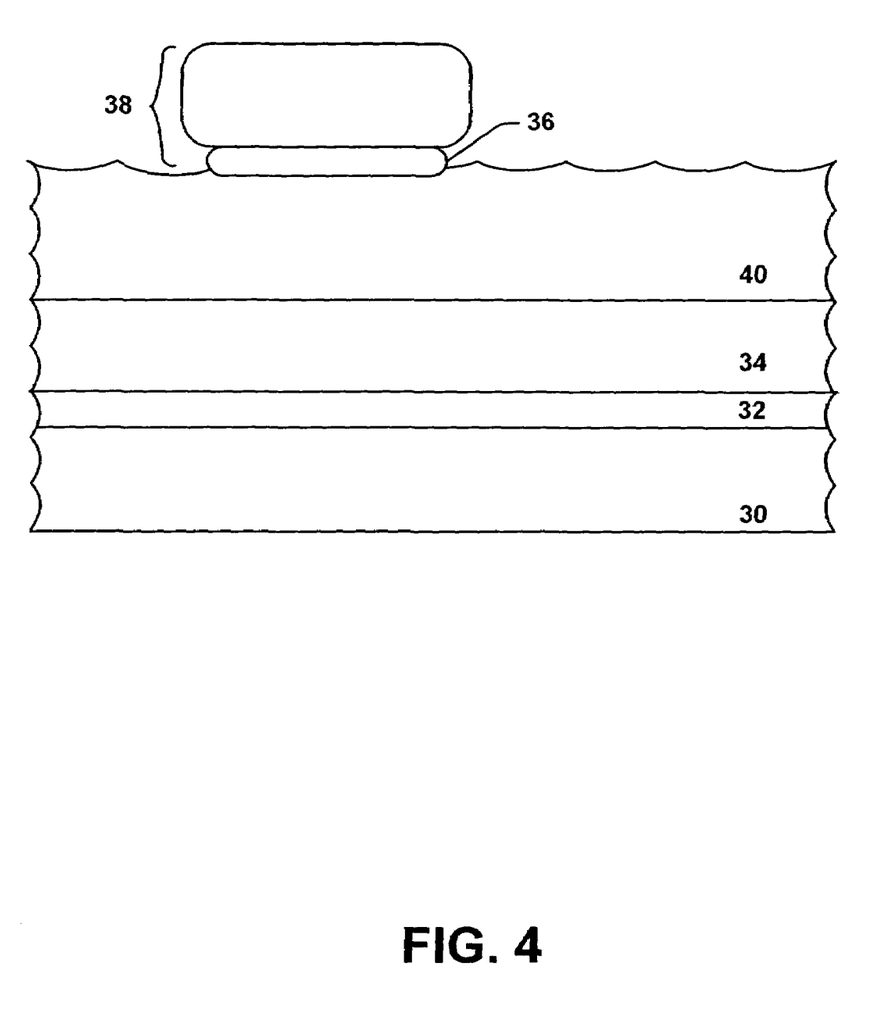
FIG. 4 is a cross sectional illustration of one aspect of an immersion lithography method using a BARC in accordance with the present invention.
Figure 5:
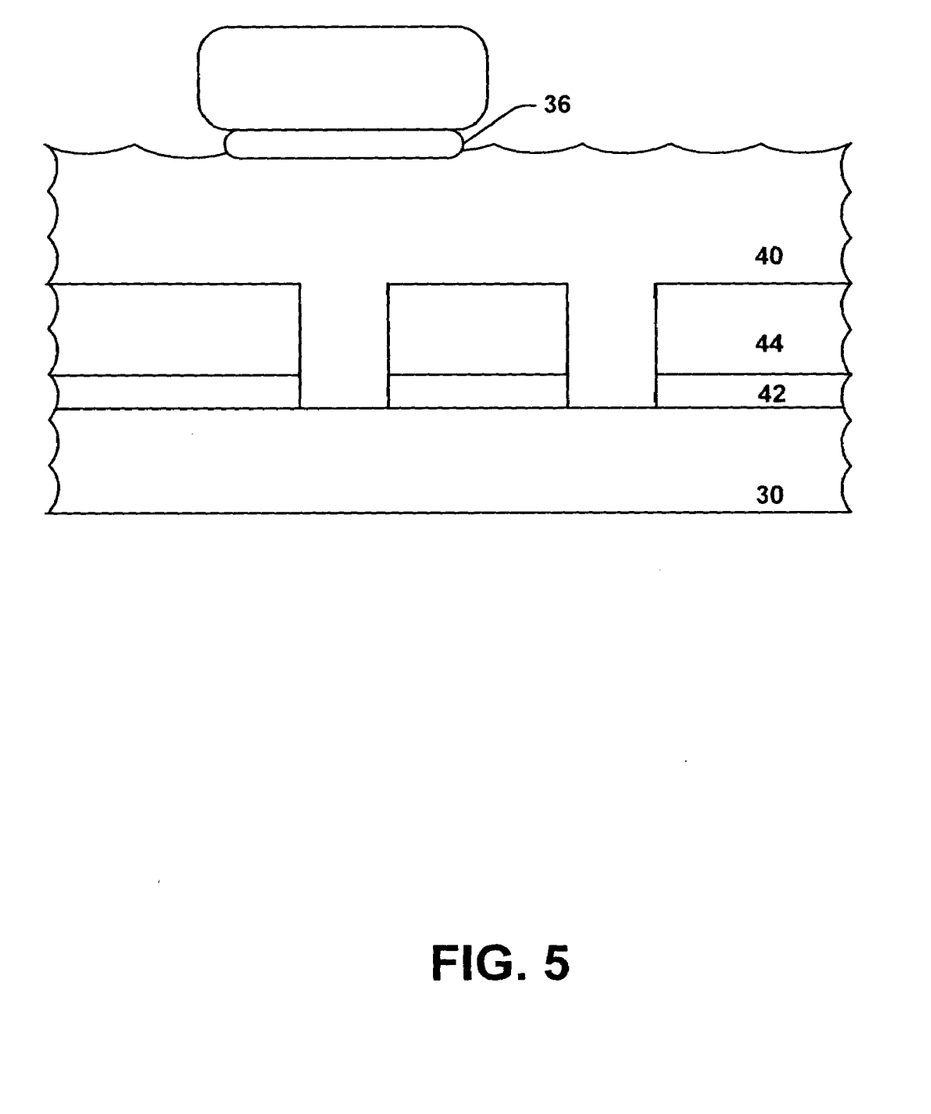
FIG. 5 is a cross sectional illustration of another aspect of an immersion lithography method using a BARC in accordance with the present invention.
Figure 6:
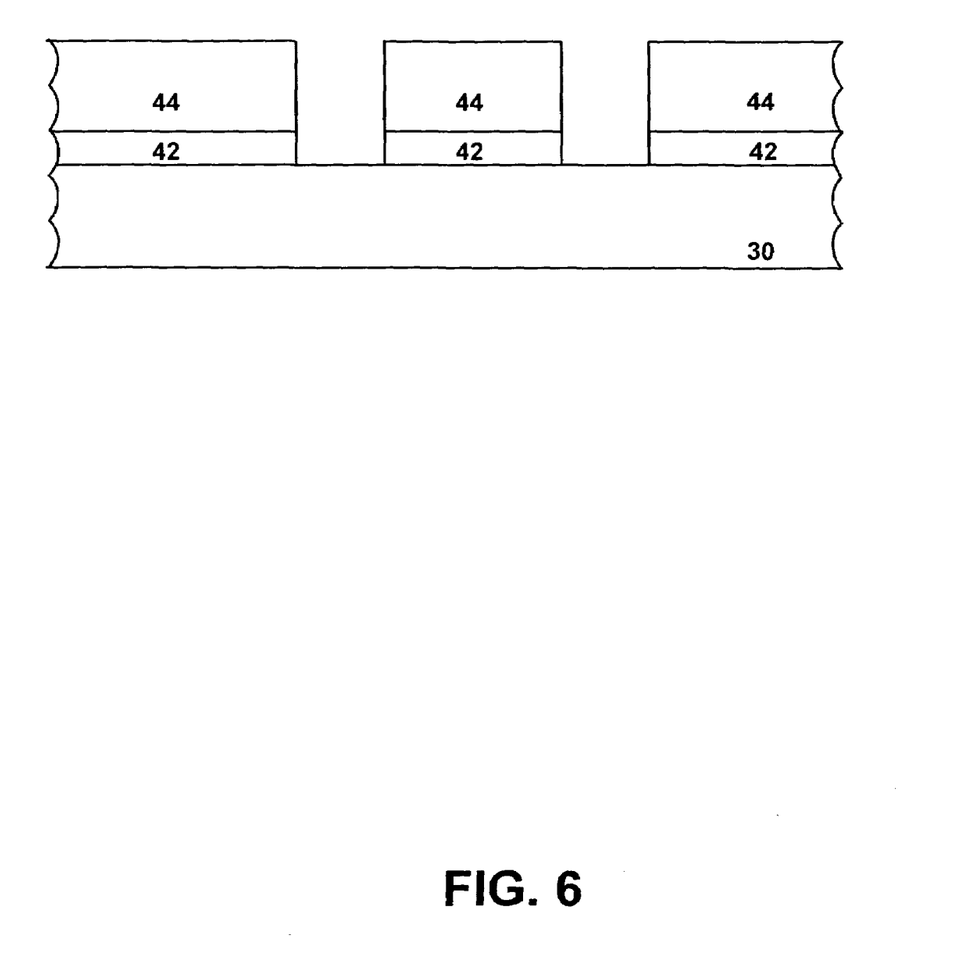
FIG. 6 is a cross sectional illustration of yet another aspect of an immersion lithography method using a BARC in accordance with the present invention.

Another aspect of the present invention is shown in FIGS. 4 to 6. Referring to FIG. 4, an immersion lithography arrangement is provided including a semiconductor substrate 30 with a BARC 32 thereover, a resist 34 over the BARC 32, and a base developer immersion lithography fluid 40 in the space between the resist 34 clad substrate 30 and an immersion lithography projection system 38. Specifically, the base developer immersion lithography fluid 40 is situated between the resist 34 and the final optic 36, such as a projection lens, of the immersion lithography projection system 38. Although not specifically shown, the immersion lithography projection system 38 can include one or more of a radiation source such as a laser, housing, motion components, imaging components such as various lenses and shutters, control components, a processor, a mask, fiber optic components, and a power supply, among other components/systems.

Radiation is generated and projected through final optic 36, such as 157 nm light, through the base developer immersion lithography fluid 40, and onto selected portions of the resist 34. In the selected portions of the resist 34, a chemical change takes place that makes either the selected portions or the unexposed portions of the resist 34 more soluble in the base developer immersion lithography fluid 40.

Referring to FIG. 5, due to this increased solubility, either the selected portions or the unexposed portions of the resist 34 go into solution, leaving a patterned resist 44 (the portions of the resist 34 that did not go into solution). As a result, portions of the BARC 32 underlying the portions of the resist 34 that go into solution are exposed to the base developer immersion lithography fluid 40. Since the BARC 32 is soluble in the base developer immersion lithography fluid 40, the exposed portions also go into solution, leaving a patterned BARC 42, the pattern of which substantially corresponds with that of the patterned resist 44. A sufficient period of time elapses so that at least substantially the entire thickness of either the selected portions or the unexposed portions of the resist 34 and the corresponding underlying portions of the BARC 32 go into solution and portions of the underlying semiconductor substrate 30 are in contact with the base developer immersion lithography fluid 40. The portions of the underlying wafer in contact with the base developer immersion lithography fluid 40 are not soluble in the base developer immersion lithography fluid 40.

Referring to FIG. 6, the base developer immersion lithography fluid 40, with either the selected portions or the unexposed portions of the resist 34 and the corresponding underlying portions of the BARC 32 solubilized therein, is removed from the immersion lithography arrangement leaving a patterned resist 44 and patterned BARC 42 clad semiconductor substrate 30. The patterned resist 44 and patterned BARC 42 have openings therein where portions of the underlying semiconductor substrate 30 are exposed. A developer is not contacted with the immersion lithography arrangement after the immersion lithography fluid is removed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An immersion lithography method, comprising:
providing a base developer as an immersion lithography fluid so as to contact a projection lens and a resist, the resist positioned over a semiconductor structure;
irradiating portions of the resist through the projection lens and the immersion lithography fluid; and
removing the immersion lithography fluid and irradiated portions of the resist to provide a patterned resist on the semiconductor structure, with the proviso that a developer is not contacted with the irradiated resist after the immersion lithography fluid is removed.

2. The immersion lithography method according to claim 1, the base developer selected from the group consisting of sodium hydroxide, potassium hydroxide, calcium hydroxide, ammonium hydroxide, tetramethylammonium hydroxide, tetraethylammonium hydroxide, dimethyldiethylammonium hydroxide, sodium bicarbonate, tetramethylammonium bicarbonate, disodium carbonate, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, 2-hydroxyl trimethyl ammonium hydroxide, lithium borate, sodium borate, sodium hydrogen-phosphate, ammonium dihydrogen-phosphate, sodium dihydrogen-phosphate, potassium dihydrogen-phosphate, lithium phosphate, lithium silicate, potassium silicate, sodium silicate, monomethylamine, dimethylamine, trimethylamine, diethylamine, triethylamine, monoiso-pyruamine, di-isopyruamine, n-propylamine, n-butylamine and 1,3-diaminopropane, di-n-propylamine, di-n-butylamine, 4,4'-diaminodiphenylamine, n,n-dimethylethylamine, n,n-diethylmethylamine, triethylamine, bis(dialkylamino)imines, monoethanolamine, diethanolamine, triethanolamine, diethylethanolamine, and propanolaminec.

3. The immersion lithography method according to claim 1, the base developer comprising tetraalkyammonium hydroxide.

4. The immersion lithography method according to claim 1, the resist comprising a negative tone resist.

5. The immersion lithography method according to claim 1, the resist comprising a positive tone resist.

6. The immersion lithography method according to claim 1, the resist irradiated with light having a wavelength of about 450 nm or less.

7. The immersion lithography method according to claim 1, the projection lens positioned about 2,500 μm or less away from the resist through the immersion lithography fluid.

8. The immersion lithography method according to claim 1, the immersion lithography fluid is removed from about 2 seconds to about 200 minutes after irradiation.

9. The immersion lithography method according to claim 1, further comprising rinsing the patterned resist on the semiconductor structure with deionized water.

10. An immersion lithography method, comprising:
providing a base developer as an immersion lithography fluid so as to contact a projection lens and a resist, the resist positioned on a bottom antireflective coating, the bottom antireflective coating positioned on a semiconductor structure;
irradiating portions of the resist through the projection lens and the immersion lithography fluid; and
removing the immersion lithography fluid, irradiated portions of the resist, and portions of the bottom antireflective coating underlying the irradiated portions of the resist to provide a patterned resist and a correspondingly patterned bottom antireflective coating on the semiconductor structure, with the proviso that a developer is not contacted with the irradiated resist after the immersion lithography fluid is removed.

11. The immersion lithography method according to claim 10, the base developer selected from the group consisting of organic amines, alkali metal hydroxides, alkaline earth metal hydroxides, ammonium hydroxides, tetraalkylammonium hydroxides, alkali metal carbonates and bicarbonates, alkaline earth metal carbonates and bicarbonates, ammonium carbonates and bicarbonates, tetraalkylammonium carbonates and bicarbonates, alkali metal borates, ammonium borates, tetratalkylammonium borates, alkali metal dihydrogen-phosphates, alkaline earth metal dihydrogen-phosphates, ammonium dihydrogen-phosphates, tetraalkylammonium dihydrogen-phosphates, alkali metal silicates, alkaline earth metal silicates, ammonium silicates, and tetraalkylammonium silicates.

12. The immersion lithography method according to claim 10, the bottom antireflective coating comprising dye and a developer soluble film forming material.

13. The immersion lithography method according to claim 10, the immersion lithography fluid having a temperature from about 10° C. to about 99° C.

14. The immersion lithography method according to claim 10, the resist is irradiated with radiation having a wavelength selected from the group consisting of about 436 nm light, about 365 nm light, about 248 nm light, about 193 nm light, about 157 nm light, about 13 nm light, about 11 nm light, X-rays, and e-beams.

15. The immersion lithography method according to claim 10, the immersion lithography fluid having a pH greater than about 10.

16. An immersion lithography method, comprising:
providing a base developer as an immersion lithography fluid so as to contact a projection lens and a resist, the resist positioned over a semiconductor structure, the immersion lithography fluid comprising a solvent and from about 0.01% to about 20% by weight of at least a base compound;
irradiating portions of the resist through the projection lens and the immersion lithography fluid; and
removing the immersion lithography fluid and irradiated portions of the resist to provide a patterned resist on the semiconductor structure, with the proviso that a developer is not contacted with the irradiated resist after the immersion lithography fluid is removed.

17. The immersion lithography method according to claim 16, the resist positioned on a bottom antireflective coating, the bottom antireflective coating positioned on a semiconductor structure.

18. The immersion lithography method according to claim 16, the base developer selected from the group consisting of organic amines, alkali metal hydroxides, alkaline earth metal hydroxides, ammonium hydroxides, tetraalkylammonium hydroxides, alkali metal carbonates and bicarbonates, alkaline earth metal carbonates and bicarbonates, ammonium carbonates and bicarbonates, tetraalkylammonium carbonates and bicarbonates, alkali metal borates, ammonium borates, tetratalkylammonium borates, alkali metal dihydrogen-phosphates, alkaline earth metal dihydrogen-phosphates, ammonium dihydrogen-phosphates, tetraalkylammonium dihydrogen-phosphates, alkali metal silicates, alkaline earth metal silicates, ammonium silicates, and tetraalkylammonium silicates.

19. The immersion lithography method according to claim 16, the resist irradiated with light having a wavelength of about 250 nm or less.

20. The immersion lithography method according to claim 16, the immersion lithography fluid is removed from about 15 seconds to about 50 minutes after irradiation.

* * * * *